(12) United States Patent
Tsai et al.

(10) Patent No.: US 11,595,050 B2
(45) Date of Patent: Feb. 28, 2023

(54) CIRCUITS AND METHODS FOR A CASCADE PHASE LOCKED LOOP

(71) Applicant: Taiwan Semiconductor Manufacturing Company, Ltd., Hsinchu (TW)

(72) Inventors: Tsung-Hsien Tsai, Taoyuan County (TW); Ruey-Bin Sheen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 43 days.

(21) Appl. No.: 17/572,703

(22) Filed: Jan. 11, 2022

(65) Prior Publication Data
US 2023/0013600 A1 Jan. 19, 2023

Related U.S. Application Data

(60) Provisional application No. 63/222,465, filed on Jul. 16, 2021.

(51) Int. Cl.
*H03L 7/099* (2006.01)
*H03L 7/081* (2006.01)

(52) U.S. Cl.
CPC .......... *H03L 7/0995* (2013.01); *H03L 7/0814* (2013.01)

(58) Field of Classification Search
CPC ........................... H03L 7/0995; H03L 7/0814
See application file for complete search history.

(56) References Cited

U.S. PATENT DOCUMENTS 5,345,434 A * 9/1994 Ide .................... G11B 7/24085
5,418,770 A * 5/1995 Ide .................... G11B 11/10595
(Continued)

FOREIGN PATENT DOCUMENTS

CN      105577173 B  *  5/2018
JP        3412882 B2  *  6/2003
(Continued)

*Primary Examiner* — Adam D Houston
(74) *Attorney, Agent, or Firm* — Jones Day

(57) ABSTRACT

Systems and methods are provided for a cascade phase locked loop. A first phase locked loop receives a reference clock signal having a first frequency and generates a high frequency clock signal that is phase aligned with the reference clock signal. A first divider divides the high frequency clock signal to generate a middle frequency clock signal, and a second divider divides the middle frequency clock signal to generate a low frequency reference clock signal. A second phase locked loop receives the low frequency reference clock signal and generates an output signal, compares the output signal to the low frequency reference clock signal to generate a frequency increasing (UP) signal that indicates a phase difference between the output signal and the low frequency reference clock signal. A delay locked loop receives the middle frequency clock signal and the frequency increasing (UP) signal and delays the middle frequency clock signal based on the frequency increasing (UP) signal to generate the realignment clock signal. The second phase lock loop receives the realignment clock signal and adjusts the phase difference between the output signal and the low frequency reference clock signal based on the realignment clock signal.

20 Claims, 18 Drawing Sheets

(56) References Cited

U.S. PATENT DOCUMENTS

| | | | | |
|---|---|---|---|---|
| 6,211,740 | B1* | 4/2001 | Dai | H03L 7/081 331/25 |
| 6,515,519 | B1* | 2/2003 | Miyazaki | G06F 1/3203 327/158 |
| 6,583,657 | B1* | 6/2003 | Eckhardt | H03K 5/1565 327/175 |
| 6,720,810 | B1* | 4/2004 | New | H03K 5/135 327/158 |
| 7,315,957 | B1* | 1/2008 | Wagner | G06F 1/324 713/502 |
| 9,236,853 | B2* | 1/2016 | Walker | H03K 5/05 |
| 10,936,003 | B1* | 3/2021 | Wu | G06F 1/08 |
| 11,398,827 | B1* | 7/2022 | Bhat | H03L 7/1075 |
| 2003/0071668 | A1* | 4/2003 | Starr | H03L 7/0891 327/157 |
| 2003/0217303 | A1* | 11/2003 | Chua-Eoan | G06F 5/06 713/600 |
| 2008/0290953 | A1* | 11/2008 | Sandner | H04B 1/7136 331/2 |
| 2010/0073051 | A1* | 3/2010 | Rao | H03L 7/1075 327/157 |
| 2010/0123496 | A1* | 5/2010 | Palmer | H03L 7/1976 327/158 |
| 2011/0227619 | A1* | 9/2011 | Kitagawa | G11C 7/222 327/158 |
| 2013/0076450 | A1* | 3/2013 | Rao | H03L 7/0896 331/34 |
| 2021/0409007 | A1* | 12/2021 | Moslehi Bajestan | H03L 7/0816 |

FOREIGN PATENT DOCUMENTS

| | | | |
|---|---|---|---|
| JP | 2004129073 A | * | 4/2004 |
| KR | 20020008804 A | * | 1/2002 |
| WO | WO-2020154989 A1 | * | 8/2020 |

* cited by examiner

(12)   United States Patent     US 11,595,050 B2

CIRCUITS AND METHODS FOR A CASCADE PHASE LOCKED LOOP

CROSS-REFERENCE TO RELATED APPLICATIONS

This application claims priority to U.S. Provisional Application No. 63/222,465, filed Jul. 16, 2021, entitled "Systems and Methods for Providing a Cascade PLL with Rate Realignment," which is incorporated herein by reference in its entirety.

TECHNICAL FIELD

The technology described in this patent document relates generally to phase locked loops.

BACKGROUND

A phase locked loop (PLL) may include a realignment clock, which is typically derived from a high quality reference clock of the PLL and thus has the same speed as the reference clock. In a ring-oscillator type PLL (RO-PLL), however, this type of realignment clock may limit the performance of phase noise during realignment mode and may also limit jitter performance.

BRIEF DESCRIPTION OF THE DRAWINGS

Aspects of the present disclosure are best understood from the following detailed description when read with the accompanying figures.

DETAILED DESCRIPTION

Figure 1:
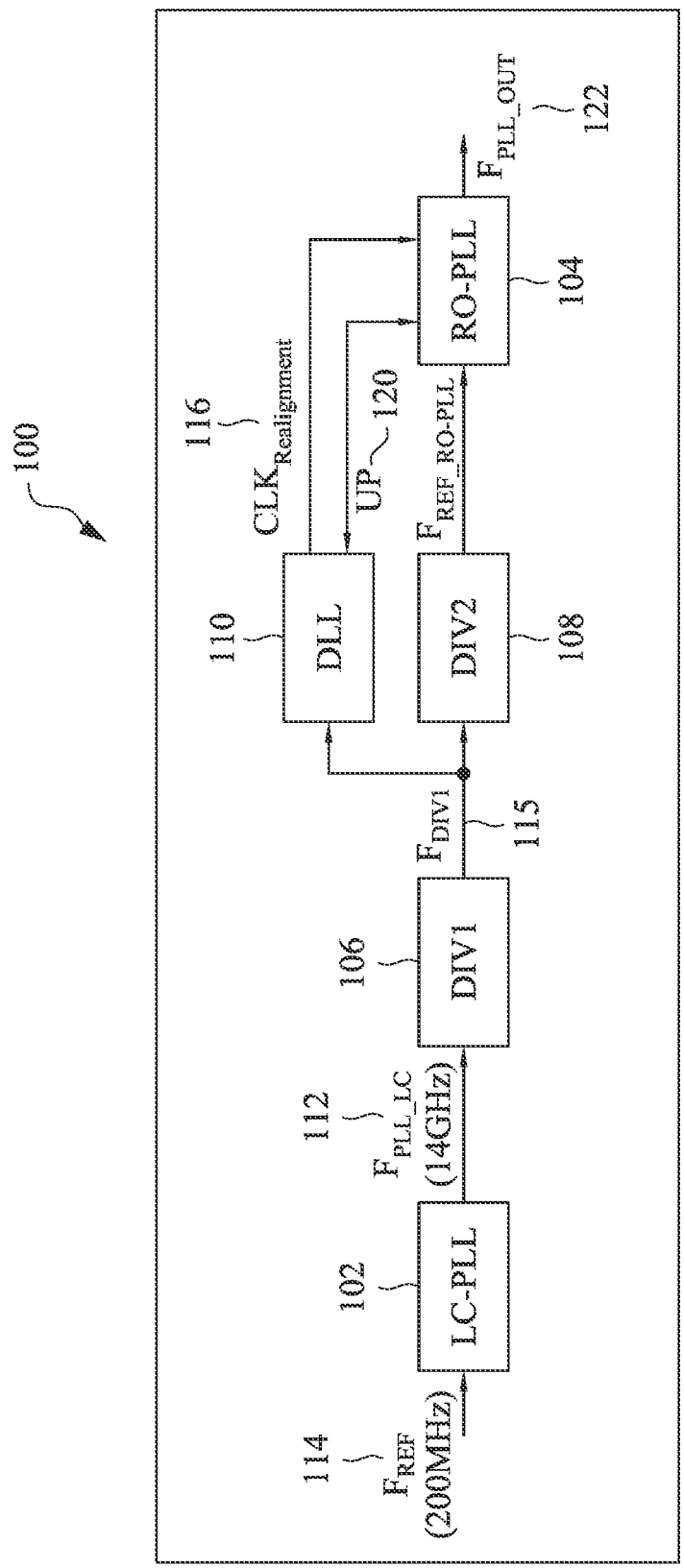
FIG. 1 is a block diagram of an example embodiment of a cascade phase locked loop circuit in accordance with embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

FIG. 1 is a block diagram of an example embodiment of a cascade phase locked loop (PLL) circuit 100. The cascade PLL circuit 100 includes a first PLL 102, a second PLL 104, a first divider 106, a second divider 108, and a delay locked loop (DLL) 110. As shown in the illustrated embodiment, the first PLL 102 may be an inductance capacitance (LC) PLL for generating a high quality and high frequency (e.g., 14 GHz) output ($F_{PLL\_LC}$) 112 from a low frequency (e.g., 200 MHz) reference clock ($F_{REF}$) 114. The second PLL 104 may be a ring-oscillator (RO) type PLL (RO-PLL). The RO-PLL 104 may, for example, be fabricated with relatively compact dimension to allow for easy integration at near-side circuits.

The first divider 112 divides the output 112 ($F_{PLL\_LC}$) of the first PLL 102 to generate a middle frequency clock signal ($F_{DIV1}$) 115. The middle frequency clock signal ($F_{DIV1}$) 115 is input to the DLL 110 and the second divider 108. In addition, the middle frequency clock signal ($F_{DIV1}$) 115 is further divided by the second divider 108 to generate a low frequency reference clock ($F_{REF\_RO-PLL}$) 118 for the reference clock input to the RO-PLL 104.

The RO-PLL 104 generates a PLL output signal ($F_{PLL\_OUT}$) 122 and compares the PLL output signal ($F_{PLL\_OUT}$) 122 in a feedback loop with the low frequency reference clock ($F_{REF\_RO-PLL}$) 118 to generate a frequency increasing (UP) signal 120 as a function of the phase difference between the PLL output signal ($F_{PLL\_OUT}$) 122 and the low frequency reference clock ($F_{REF\_RO-PLL}$) 118, for example as described below with reference to the embodiment shown in FIG. 2. The frequency increasing (UP) signal 120 is input to the DLL 110, which adjusts the phase of the middle frequency clock signal ($F_{DIV1}$) 115 based on the frequency increasing (UP) signal 120 to generate a realignment clock signal ($CLK_{Realignment}$) 116 for the RO-PLL 104. The realignment clock signal ($CLK_{Realignment}$) 116 tunes a voltage controlled oscillator (VCO) in the RO-PLL 104 to align the phase of the PLL output signal ($F_{PLL\_OUT}$) 122 with the phase of the low frequency reference clock ($F_{REF}$ RO-PLL) 118, for example as detailed below with reference to the embodiment shown in FIG. 2.

In embodiments, the ratio of $F_{PLL\_OUT}$ and the realignment clock signal ($CLK_{Realignment}$) 116 can be controlled by the dividing number of the first divider 112 and not limited by the dividing number of the second divider 108. In the illustrated embodiment, the ratio of $F_{PLL\_OUT}$ and the realignment clock signal ($CLK_{Realignment}$) 116 is 4 from a 14 GHz $F_{PLL\_OUT}$ and a 3.5 GHz realignment clock signal ($CLK_{Realignment}$) 116.

Figure 2:
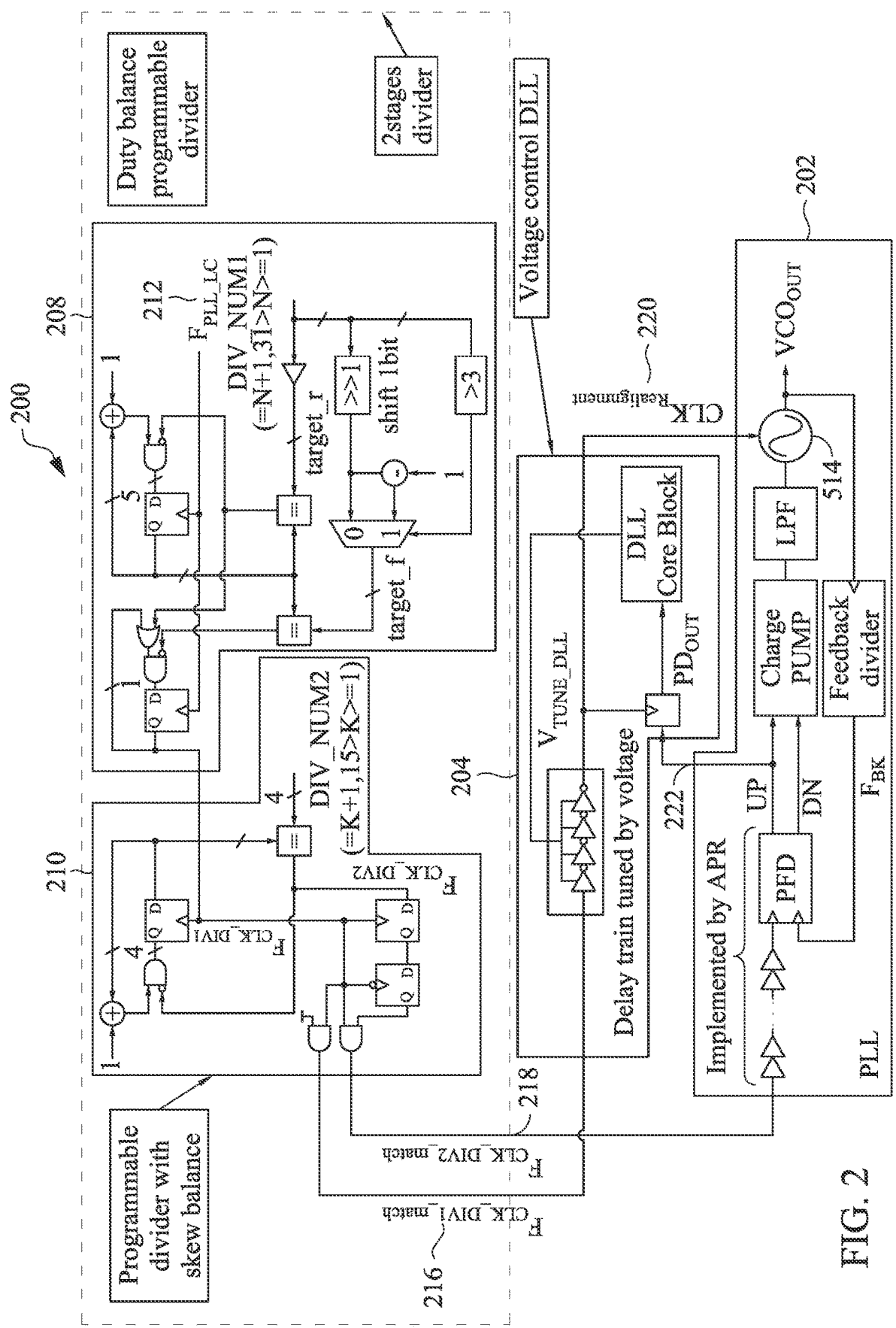
FIG. 2 is a block diagram of another example embodiment of a cascade phase locked loop circuit in accordance with embodiments.

FIG. 2 is a block diagram of another example embodiment of a cascade phase locked loop circuit 200. The cascade PLL circuit 200 includes a ring-oscillator PLL 202, a voltage-controlled delay locked loop (DLL) 204, and a two-stage programmable divider 206. The two-stage programmable divider 206 includes a first divider stage 208 and a second divider stage 210. As shown in the illustrated embodiment, the first divider stage 208 may be a duty balance programmable divider that receives a high frequency clock signal ($F_{PLL\_LC}$) 212 from a first PLL (not shown), for example from an LC-PLL 102 as shown in FIG. 1, and divides the high frequency clock signal ($F_{PLL\_LC}$) 212 to generate a middle frequency clock output ($F_{CLK\_DIV1}$) 214. The second divider stage 210 may be a programmable divider with skew balance that divides the middle frequency clock output ($F_{CLK\_DIV1}$) 214 and generates two different speed clock outputs, a matched middle frequency clock ($F_{CLK\_DIV1\_match}$) 216 and a matched low frequency clock ($F_{CLK\_DIV2\_match}$) 218, with skew balance. The operation of the first divider stage 206 is described in more detail below with reference to FIGS. 2A and 3, and the operation of the second divider stage is described in more detail below with reference to FIGS. 2B and 4.

The voltage-controlled DLL 204 operates to cancel the latency of the APR path in the ring-oscillator PLL 202 to ensure that the rising edge of the realignment clock signal ($CLK_{Realignment}$) 220 can align with the frequency increasing (UP) signal 222. The reference clock for the ring-oscillator PLL 202 is the matched low frequency clock ($F_{CLK\_DIV2\_match}$) 218 from the two-stage programmable divider 206. The operation of the voltage-controlled DLL 204 and the ring-oscillator PLL2 is described in more detail below with reference to FIGS. 2C and 5.

Figure 2A:
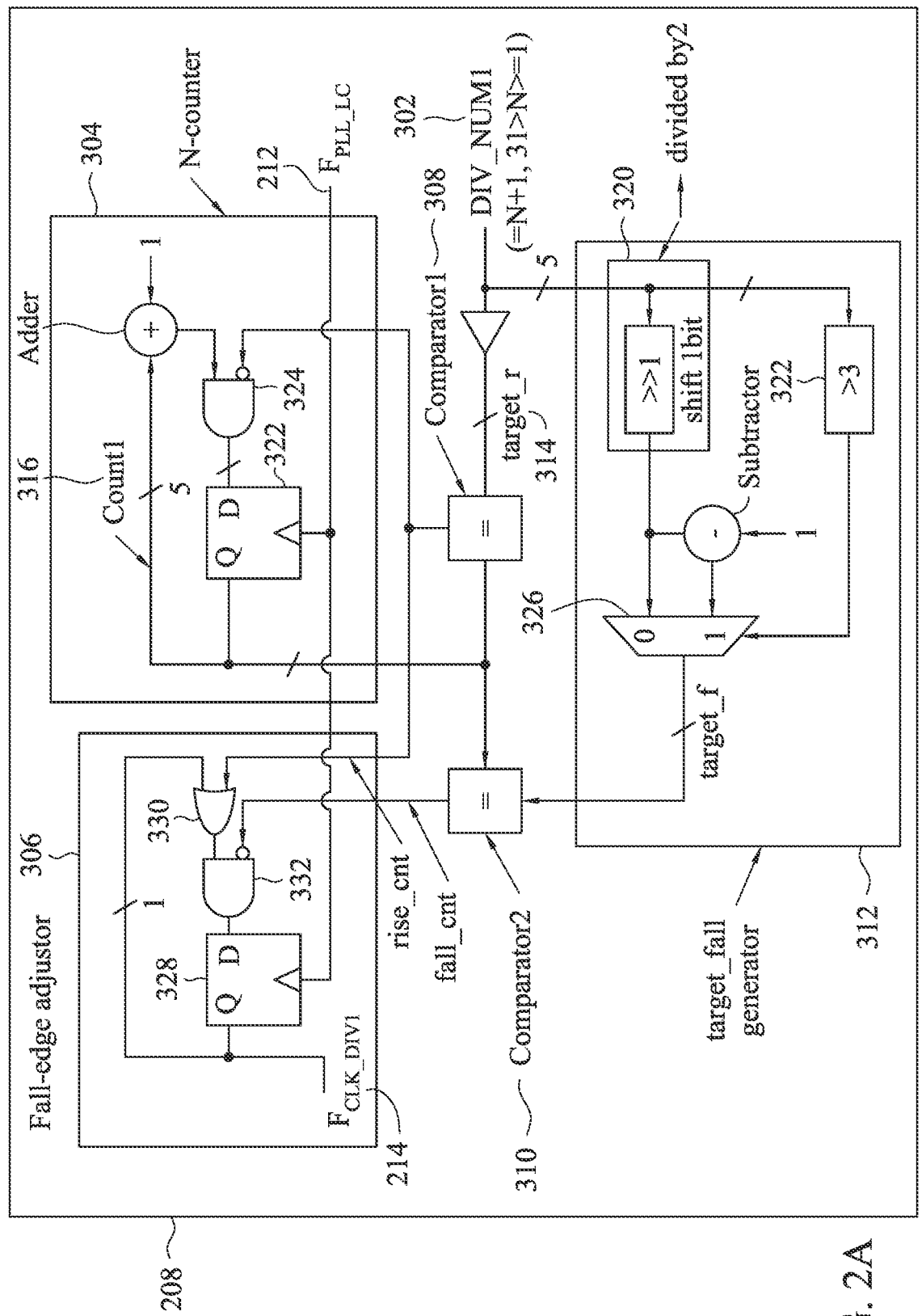
FIG. 2A further illustrates the first divider stage of FIG. 2.
Figure 3:
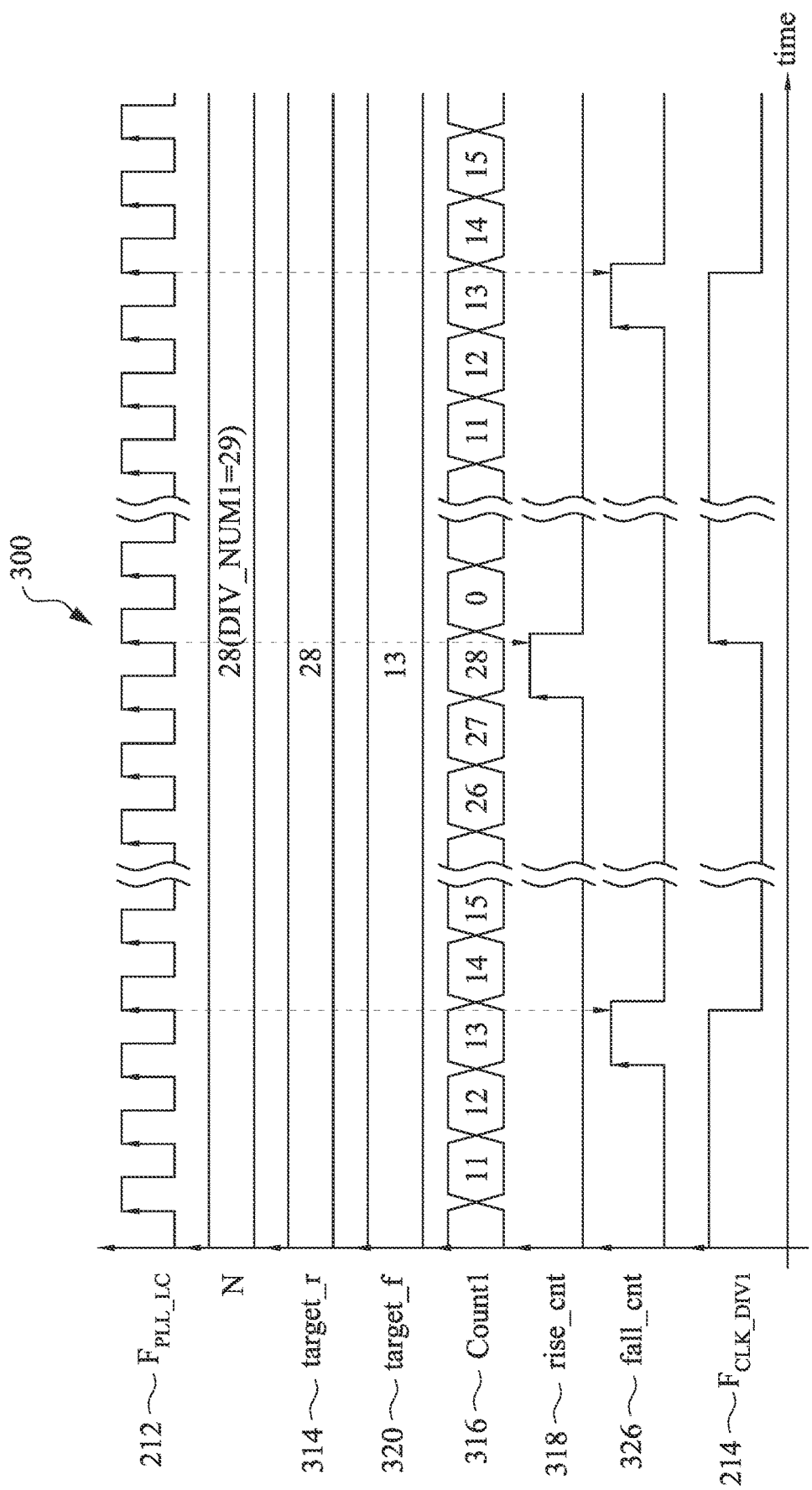
FIG. 3 is a timing diagram showing an example operation of the first divider stage of FIG. 2.

The first divider stage 208 of FIG. 2 is further illustrated in FIG. 2A, and an example operation of the first divider stage 208 is illustrated by the timing diagram 300 shown in FIG. 3. The first divider stage 208 in the illustrated example is a duty balance programmable divider that tunes the falling edge of the middle frequency clock output ($F_{CLK\_DIV1}$) 214 based on dividing numbers (DIV_NUM1) 302. The duty balance programmable divider 208 includes an N-counter 304, a fall-edge adjustor 306, a first comparator 308, a second comparator 310, and a target fall generator 312.

In operation, the divide number (DIV_NUM1) 302 is shifted by 1 to generate a rising target signal (target_r) 314 (i.e., the value of target_r=N=DIV_NUM1-1), which controls the rising edge of the middle frequency clock ($F_{CLK\_DIV1}$) 214 based on a count signal (Count1) 316 from the N-counter 304. The divide number (DIV_NUM1) 302 is also input to the target-fall generator 312 to generate a falling target signal (target_f) 320, which controls the falling edge of the middle frequency clock ($F_{CLK\_DIV1}$) 214 based on the count signal (Count1) 316.

More particularly, the rising target signal (target_r) 314 is compared with the count signal (Count1) 316 from the N-counter 304 by the first comparator 308 to generate a rise control signal (rise_cnt) 318 that triggers the rising edge of the middle frequency clock output ($F_{CLK\_DIV1}$) 214 in the fall-edge adjustor 306. The N-counter includes a first latch (e.g., a D flip-flop) 322, a first logic (AND) gate 324, and an adder 326. The rise control signal (rise_cnt) 318 is received at a first, inverted input to the logic gate 324, and an output from the adder 326 is received at a second input to the logic gate 324. The output of the logic gate 324 is received at an input (D) to the first latch 322, and the high frequency clock signal ($F_{PLL\_LC}$) 212 is received at a clock input to the first latch 322, such that the high frequency clock signal ($F_{PLL\_LC}$) 212 triggers the output of the first latch 322 to generate the count signal (Count1) 316 at the output (Q) of the first latch 322. The adder 326 receives the count signal (Count1) 316 at a first input and receives a value of "1" at a second input, which are combined to generate the second input to the logic gate 324.

The target fall generator 312 includes a divider 320, a comparison circuit 322, a subtractor 324, and a selection circuit (e.g., multiplexer) 326. The divide number (DIV_NUM1) 302 is input to the divider 320, which divides the divide number (DIV_NUM1) 302 by 2 to generate a first input to the subtractor 324 and a first input to the selection circuit 326. The divide number (DIV_NUM1) 302 is also input to the comparison circuit, which generates a control input to the selection circuit 326 based on whether the divide number (DIV_NUM1) 302 is greater than 3. The subtraction circuit 324 subtracts the output of the divider 320 by a value of "1" to generate the second input to the selection circuit. The selection circuit 326 is controlled by the output of the comparison circuit 322 to select either the output of the divider 320 or the output of the subtractor 324 as the falling target signal (target_f) 320. The a falling target signal (target_f) 320 is compared with the count signal (Count1) 316 from the N-counter 304 by the second comparator 310 to generate a fall control signal (fall_cnt) 326 that triggers the falling edge of the middle frequency clock ($F_{CLK\_DIV1}$) 214 in the fall-edge adjustor 306.

The fall-edge adjustor 306 includes a second latch (e.g., D flip-flop) 328, a second logic (OR) gate 330, and a third logic (AND) gate 332. The second logic gate 330 receives the rise control signal 318 as a first input and a feedback of the middle frequency clock output ($F_{CLK\_DIV1}$) 214 as a second input. The output of the second logic gate 330 is received at a first input to the third logic gate 332 and the fall control signal 326 is received at a second, inverted input to the third logic gate 332. The output of the third logic gate 332 is received at an input (D) to the second latch 328, and the high frequency clock signal ($F_{PLL\_LC}$) 212 is received at a clock input to the second latch 328, such that the high frequency clock signal ($F_{PLL\_LC}$) 212 triggers the output of the second latch 328 to generate the middle frequency clock output ($F_{CLK\_DIV1}$) 214 at the output (Q) of the second latch 328.

An example operation of the duty balance programmable divider 208 is shown in the timing diagram 300 illustrated in FIG. 3. As shown in FIG. 3, when the rise control signal (rise_cnt) 318 goes logic high, the middle frequency clock output ($F_{CLK\_DIV1}$) 214 is triggered to logic high; and the fall control signal (fall_cnt) 326 goes to logic high to reset the fall-edge adjustor 306 and pull the middle frequency clock output ($F_{CLK\_DIV1}$) 214 to logic low.

In the illustrated example, the divide number (DIV_NUM1) 302 is set at 29 and the "N" value is 28, causing the frequency of the middle frequency clock output ($F_{CLK\_DIV1}$) 214 to be 1/29 the frequency of the high frequency clock signal ($F_{PLL\_LC}$) 212 (i.e., $F_{CLK\_DIV1}=F_{PLL\_LC/29}$). When "N" is input, the value of the rising target signal (target_r) 314 is the same as the value of N. The falling target signal (target_f) 320 is calculated by the target fall generator 208, such that if N is larger than 3, then the falling target signal (target_f) 320 will take the integer part of N/2 minus "1" (i.e., INT(N/2)−1); and if N is less than or equal to 3, then the falling target signal (target_f) 320 will only take the integer part of N/2 (i.e., INT(N/2)). When the count signal (Count1) 316 is equal to the falling target signal (target_f) 320, the fall control signal (fall_cnt) 326 goes to logic high to reset the second latch 328 of the fall-edge adjustor 306, pulling the middle frequency clock output ($F_{CLK\_DIV1}$) 214 to logic low. When the count signal (Count1) 316 is not equal to the falling target signal (target_f) 320, the fall control signal (fall_cnt) 326 is at logic low, releasing the second latch 328 of the fall-edge adjustor 306 from the reset state. The rising edge of middle frequency clock output ($F_{CLK\_DIV1}$) 214 is triggered by the rise control signal (rise_cnt) 318, which is enabled by the count signal (Count1) 316 being equal to the rising target signal (target_r) 314. When the rising target signal (target_r) 314 goes to logic high, the fall-edge adjustor 306 is latched at logic high until the fall control signal (fall_cnt) 326 resets the second latch 328 of the fall-edge adjustor 306.

In embodiments, the duty balance programmable divider 208 may maintain a high duty-cycle in comparison to a conventional divider, for example embodiments of the duty balance programmable divider may maintain a duty-cycle above 40% with a divide number (DIV_NUM1) 302 of 5. In embodiments, the divide number (DIV_NUM1) 302 may be more than 20 for general usage.

Figure 2B:
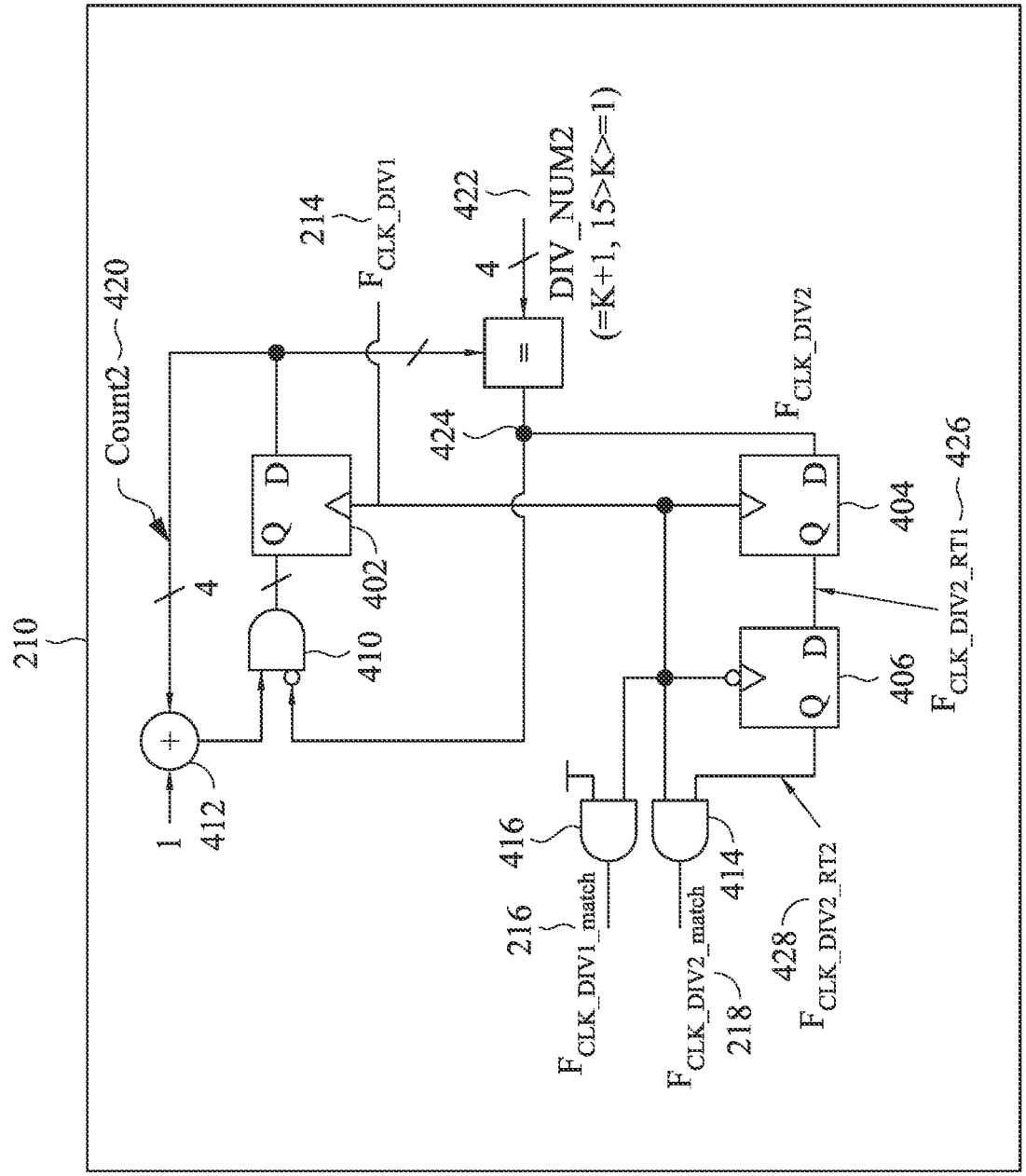
FIG. 2B further illustrates the second divider stage of FIG. 2.
Figure 4:
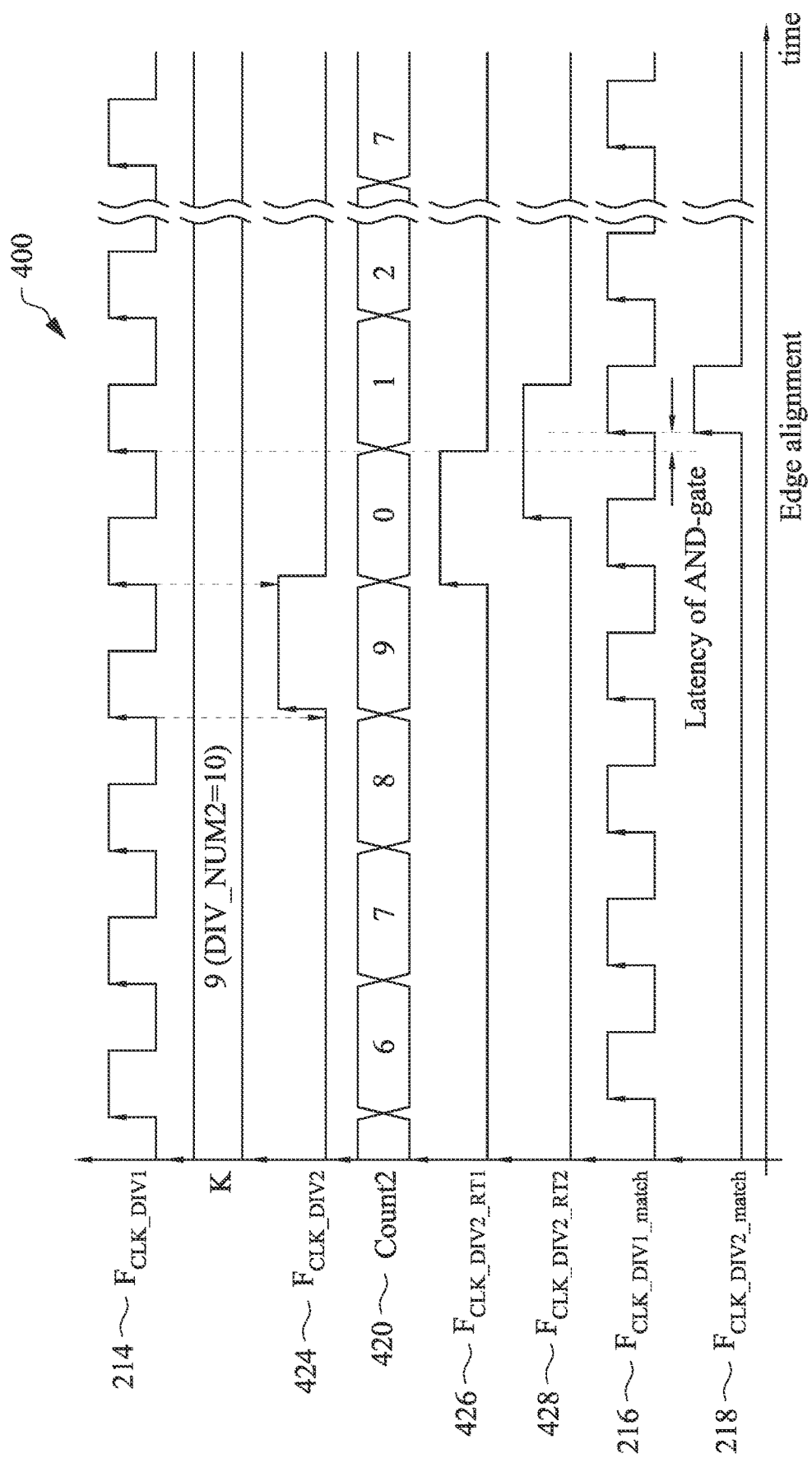
FIG. 4 is a timing diagram showing an example operation of the second divider stage of FIG. 2.

The second divider stage 210 of FIG. 2 is illustrated in FIG. 2B, and an example operation of the second divider stage 210 is illustrated by the timing diagram 400 shown in FIG. 4. The second divider stage 210 in the illustrated embodiment includes a programmable divider with skew balance that divides the middle frequency clock output ($F_{CLK\_DIV1}$) 214 and generates two different speed clock outputs, a middle frequency clock ($F_{CLK\_DIV1\_match}$) 216 and a low frequency clock ($F_{CLK\_DIV2\_match}$) 218, with skew balance. In particular, the second divider stage 210 includes a first latch (e.g., D flip-flop) 402, a second latch (e.g., D flip-flop) 404, a third latch (e.g., D flip-flop) 406, a programmable divider 408, a first logic (AND) gate 410, and adder 412, a second logic (AND) gate 414, and a third logic (AND) gate 416.

The programmable divider 408 receives a second count signal (Count2) 420 and also receives a second divide number (DIV_NUM2) 422, and divides the second count signal (Count2) 420 based on the second divide number 422 to generate a low frequency clock ($F_{CLK\_DIV2}$) 424. The a low frequency clock ($F_{CLK\_DIV2}$) 424 is input to a first, inverted input to the first logic gate 410. The adder 412 adds a value of "1" to the second count signal (Count2) 420 to generate a second input to the first logic gate 410. The output of the first logic gate 410 is received at an input (D) to the first latch 402, and the middle frequency clock ($F_{CLK\_DIV1}$) 214 is received at a clock input to the first latch 402, such that the middle frequency clock ($F_{CLK\_DIV1}$) 214 triggers the output of the first latch 402 to generate the second count signal (Count2) 420 at the output (Q) of the first latch 402.

With reference to FIG. 2, the rising edge of the PLL output ($VCO_{OUT}$) 422 is realigned for phase noise reduction based on the middle frequency clock ($F_{CLK\_DIV1}$) 214. However, in order to reduce skew between the frequency increasing (UP) signal 222 and the realignment clock signal ($CLK_{Realignment}$) 220, the low frequency clock ($F_{CLK\_DIV2}$) 424 should be aligned with the middle frequency clock ($F_{CLK\_DIV1}$) 214. The second divider stage 210 therefore generates the matched middle frequency clock ($F_{CLK\_DIV1\_match}$) 216 and the matched low frequency clock ($F_{CLK\_DIV2\_match}$) 218, as phase-aligned versions of the phase-aligned versions of the middle frequency clock ($F_{CLK\_DIV1}$) 214 and low frequency clock ($F_{CLK\_DIV2}$) 424, respectively.

With reference again to FIG. 2B, the low frequency clock ($F_{CLK\_DIV2}$) 424 is received at an input (D) to the second latch 404, and the middle frequency clock ($F_{CLK\_DIV1}$) 214 is received at a clock input to the second latch 402, such that the middle frequency clock ($F_{CLK\_DIV1}$) 214 triggers the second latch 404 to generate a first re-timed clock signal ($F_{CLK\_DIV2\_RT1}$) 426 at the output (Q) of the second latch 404. The first re-timed clock signal ($F_{CLK\_DIV2\_RT1}$) 426 is then received at an input (D) to the third latch 406, and an inversion of the middle frequency clock ($F_{CLK\_DIV1}$) 214 is received at a clock input to the third latch 406, such that the inverted middle frequency clock ($F_{CLK\_DIV1}$) 214 triggers the third latch 406 to generate a second re-timed clock signal ($F_{CLK\_DIV2\_RT2}$) 428 at the output (Q) of the third latch 404. In operation, the second and third latches 404, 406 resample the low frequency clock ($F_{CLK\_DIV2}$) 424 by the rising and falling edges of the middle frequency clock ($F_{CLK\_DIV1}$) 214 to generate the second re-timed clock signal ($F_{CLK\_DIV2\_RT2}$) 428. The second logic (AND) gate 414 receives the second re-timed clock signal ($F_{CLK\_DIV2\_RT2}$) 428 at a first input and receives the middle frequency clock ($F_{CLK\_DIV1}$) 214 at a second input, and generates the matched low frequency clock ($F_{CLK\_DIV2\_match}$) 218, which has the same rising edge as the middle frequency clock ($F_{CLK\_DIV1}$) 214. In order to further reduce skew between the low and middle frequency clock signals (by accounting for the latency of the logic gate 414), the middle frequency clock ($F_{CLK\_DIV1}$) 214 is input to the third logic (AND) gate 416, which has a dummy input (logic high) at its second input, and generates the matched middle frequency clock ($F_{CLK\_DIV1\_match}$) 216, cancelling any latency between the low and middle frequency clocks.

An example operation of the second divider stage 210 is shown in the timing diagram 400 illustrated in FIG. 4. As shown in FIG. 4, the rising and falling edges of the low frequency clock ($F_{CLK\_DIV2}$) 424 may be misaligned with the rising edges of the middle frequency clock ($F_{CLK\_DIV1}$) 214. However, as illustrated, the rising edges of the matched low frequency clock ($F_{CLK\_DIV2\_match}$) 218 and the matched middle frequency clock ($F_{CLK\_DIV1\_match}$) 216 are aligned.

Figure 2C:
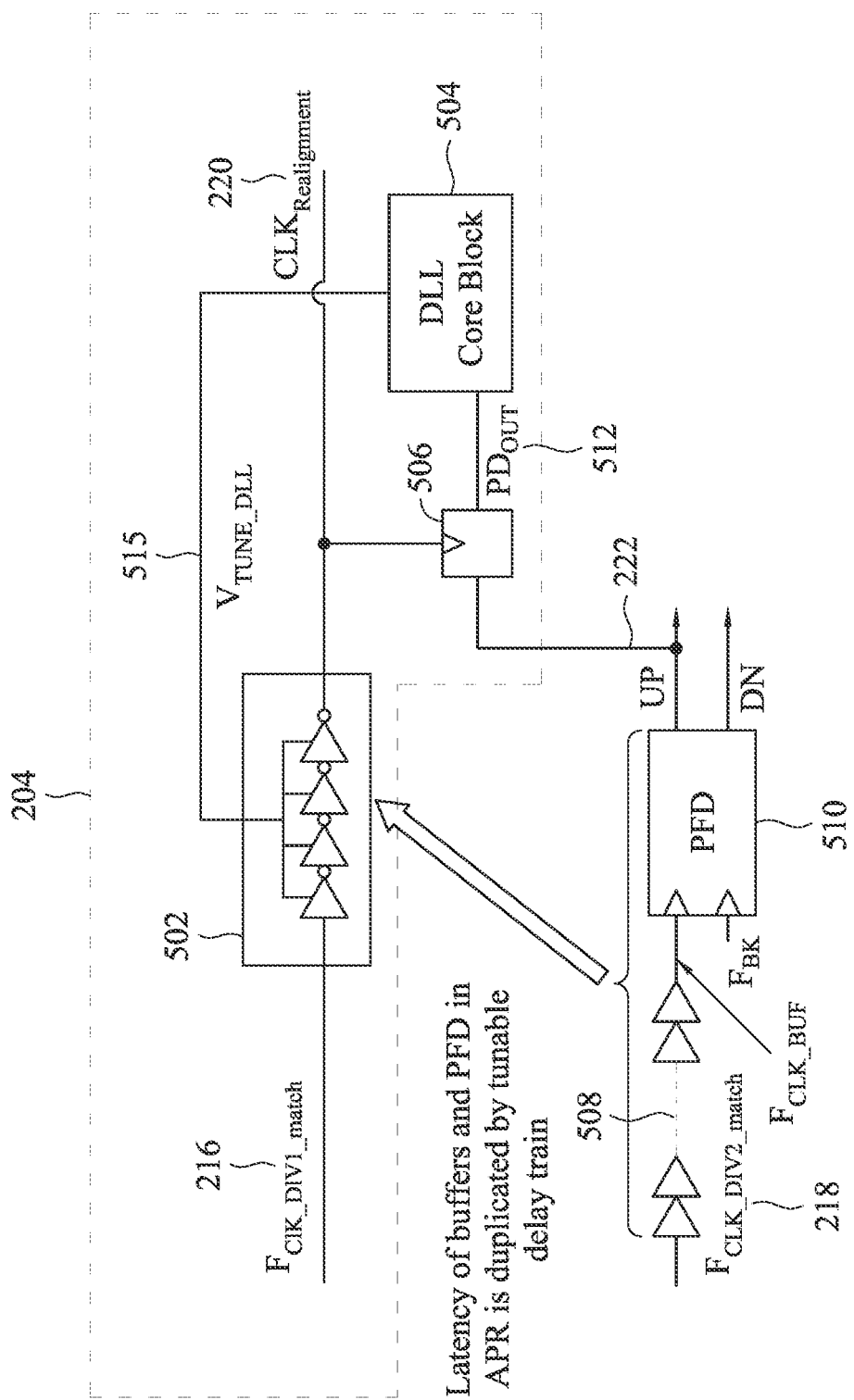
FIGS. 2C-2E further illustrate the voltage-controlled DLL and portions of the ring-oscillator PLL of FIG. 2.
Figure 5:
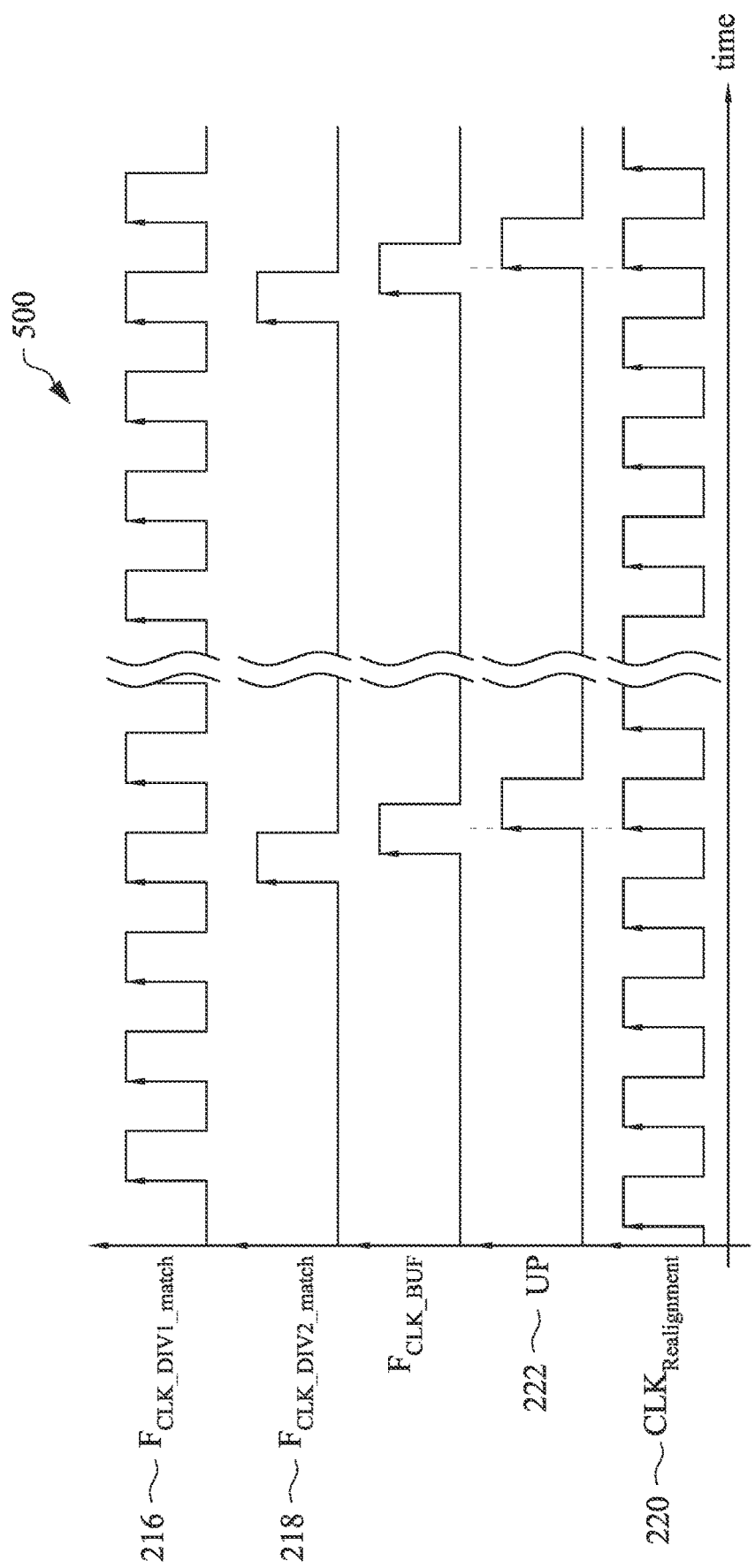
FIG. 5 is a timing diagram showing an example operation of the voltage-controlled DLL of FIG. 2.

An example of the voltage-controlled DLL 204 and portions of the ring-oscillator PLL 202 of FIG. 2 are further illustrated in FIG. 2C, and an example operation is illustrated in the timing diagram 500 shown in FIG. 5. The voltage-controlled DLL 204 includes a voltage-controlled delay train 502, a DLL core block 504, and a latch 506. Also illustrated in FIG. 2C are a series of delay buffers 508 and a phase frequency detector (PFD) 510 from the ring-oscillator PLL 202 of FIG. 2.

The voltage-controlled delay train 502 may, for example, be an analog circuit that applies a variable amount of delay based on the value of a delay tuning voltage ($V_{TUNE\_DLL}$) 508 received from the DLL core block 504. In operation, the voltage-controlled delay train 502 delays the matched middle frequency clock ($F_{CLK\_DIV1\_match}$) 216 by a delay amount controlled by the delay tuning voltage ($V_{TUNE\_DLL}$) 515 to generate the realignment clock signal ($CLK_{Realignment}$) 220. The realignment clock signal ($CLK_{Realignment}$) 220 is used as the clock input to the latch 506 in order to sample the increasing (UP) signal 222 to generate a phase detector output ($PD_{OUT}$) signal 512 that is input to the DLL core block 504. The DLL core block 504 generates the delay tuning voltage ($V_{TUNE\_DLL}$) 515 as a function of the phase detector output ($PD_{OUT}$) signal 512 in order to tune the latency of the delay-train 502 to be the same or substantially the same as the latency of the delay buffers 508 and a phase frequency detector (PFD) 510 in the ring-oscillator PLL 202.

Figure 2D:
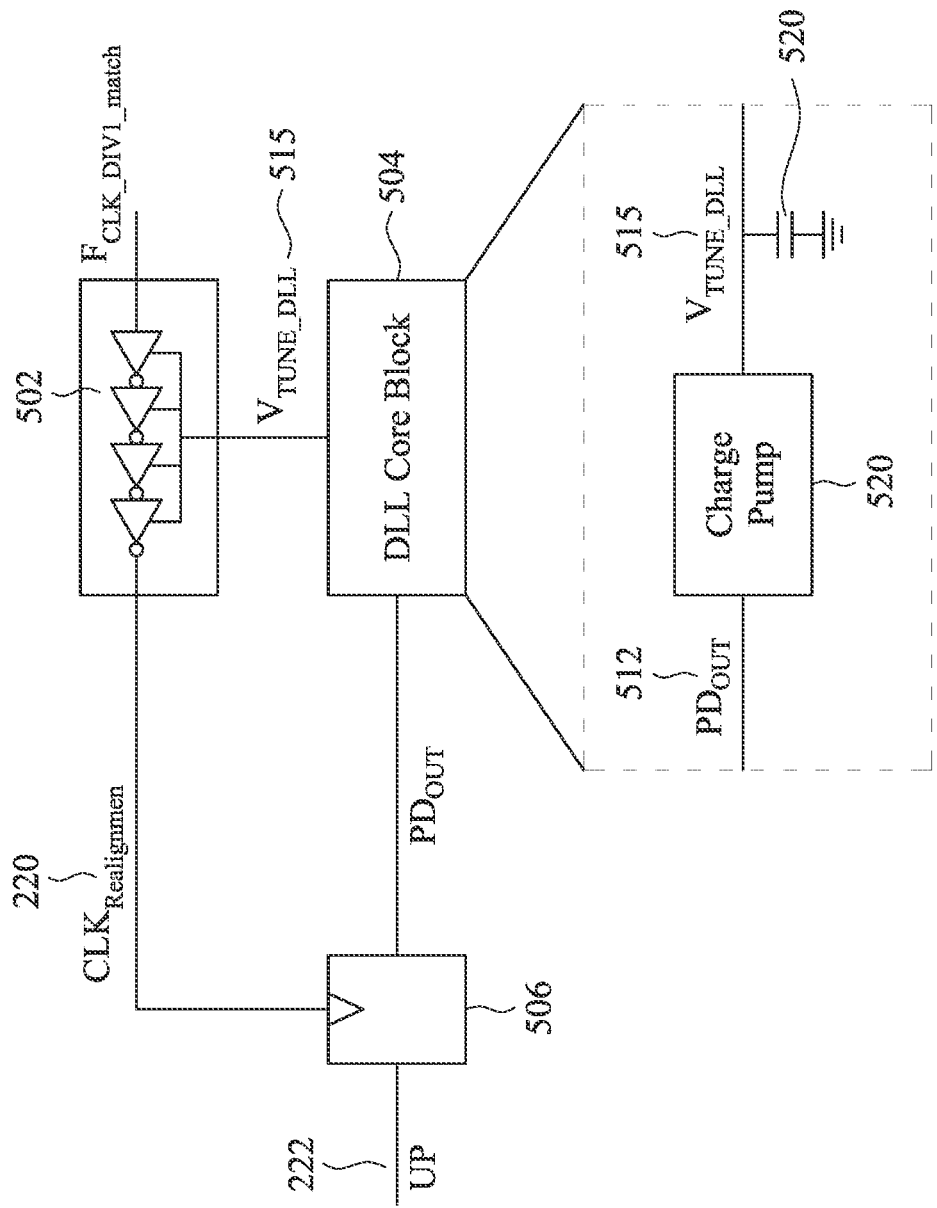
Figure 2E:
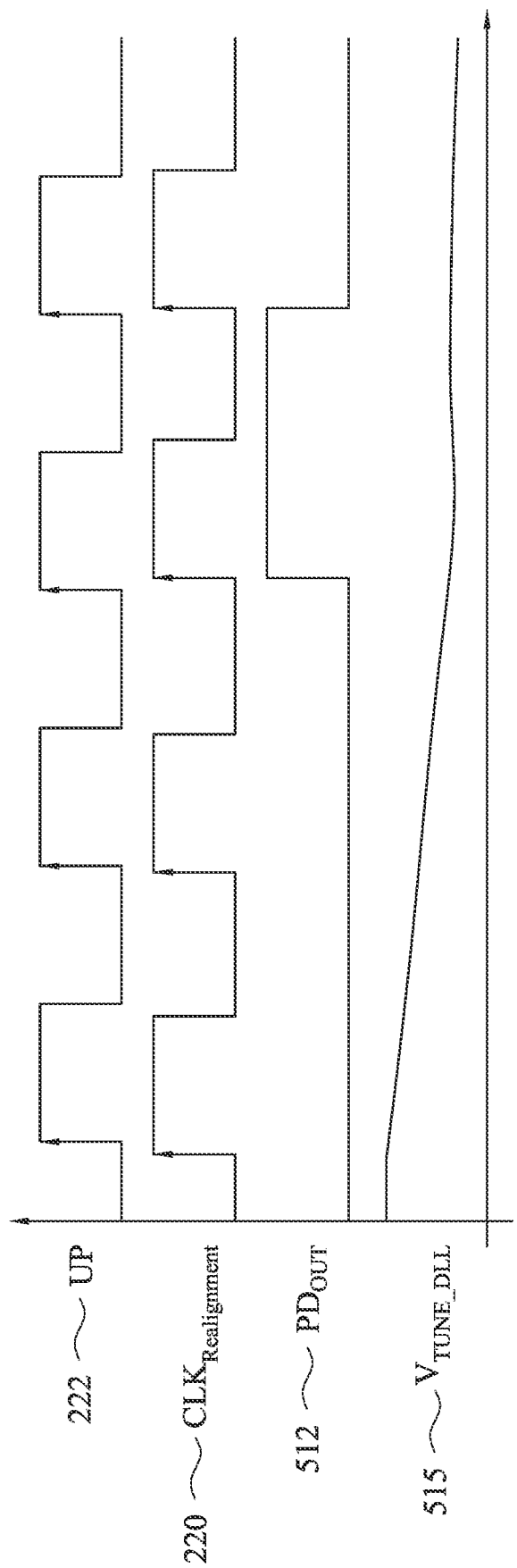

An example implementation of the DLL core block 504 is illustrated in FIG. 2D and an example operation of the DLL core block 504 is illustrated by the timing diagram shown in FIG. 2E. As shown in FIG. 2D, the DLL core block 504 may include a charge pump 520 that receives the phase detector output ($PD_{OUT}$) signal 512 and generates the delay tuning voltage ($V_{TUNE\_DLL}$) 515 and a tuning filter (capacitor) 522 coupled to the delay tuning voltage ($V_{TUNE\_DLL}$) 515. As shown in FIG. 2E, when the charge pump 520 receives a logic low level on the $PD_{OUT}$ signal 512, it causes the delay tuning voltage ($V_{TUNE\_DLL}$) 515 to decrease (increasing the latency of the voltage-controlled delay train 502). When phases of the increasing (UP) signal 222 and the realignment clock signal ($CLK_{Realignment}$) 220 are substantially aligned, the $PD_{OUT}$ signal 512 toggles from logic low to logic high. A logic high level on the $PD_{OUT}$ signal 512 causes the delay tuning voltage ($V_{TUNE\_DLL}$) 515 to maintain a stable voltage.

With reference again to FIG. 2C, the matched low frequency clock ($F_{CLK\_DIV2\_match}$) 218 is input to the delay buffers 508 in order to provide the reference clock of the ring-oscillator PLL 202. The matched low frequency clock ($F_{CLK\_DIV2\_match}$) 218, delayed by buffers 508, is input to the phase frequency detector (PFD) 510 where it is compared to a feedback signal ($F_{BK}$) 514 to generate the increasing (UP) signal 222. In order to optimize performance, the rising edge of the realignment clock signal ($CLK_{Realignment}$) 220 should be aligned with the increasing (UP) signal 222 to avoid an unexpected loop conflict between the main PLL loop and the realignment loop. The voltage-controlled DLL 204 is thus included to cancel the latency of the delay buffers 508 and a phase frequency detector (PFD) 510, which are typically implemented during an automatic place and route (APR) operation.

An example operation of the voltage-controlled DLL 204 is shown in the timing diagram 500 illustrated in FIG. 5. As shown in FIG. 5, the voltage-controlled DLL 204 causes alignment of the rising edges of the realignment clock signal ($CLK_{Realignment}$) 220 and the increasing (UP) signal 222.

With reference again to FIG. 2, the realignment clock signal ($CLK_{Realignment}$) 220 is received by a voltage controlled oscillator (VCO) 514 in the ring-oscillator PLL 202. The realignment clock signal ($CLK_{Realignment}$) 220 tunes the 514 to align the phase of the PLL output signal ($VCO_{OUT}$) 424 based on the phase of the matched low frequency clock ($F_{CLK\_DIV2\_match}$) 218, for example as described in commonly-owned U.S. patent application Ser. No. 17/349,991, which is incorporated herein by reference.

Figure 6:
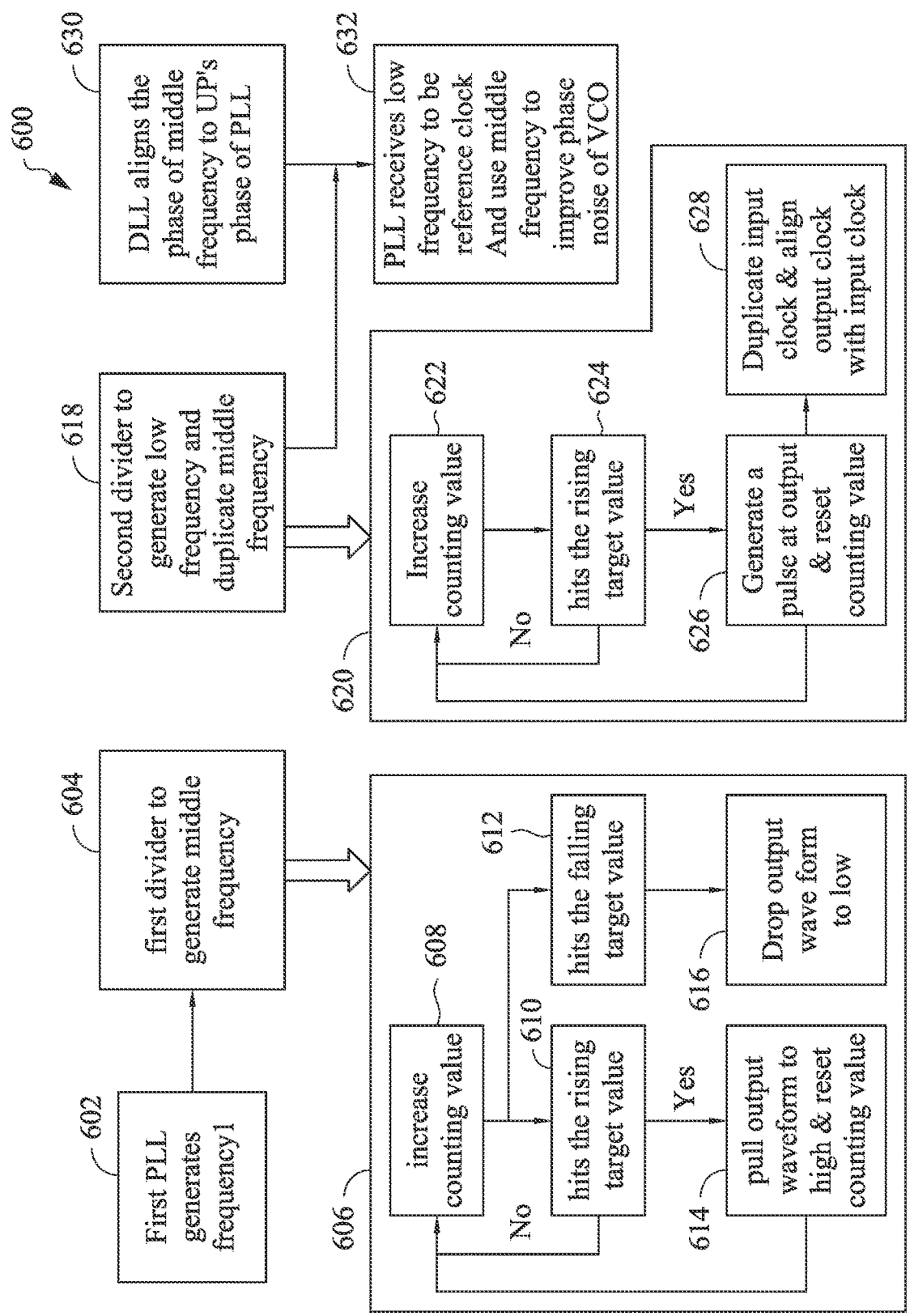
FIG. 6 is a flow diagram illustrating an example method for operating a cascade phase locked loop circuit, for example as shown in FIG. 2

FIG. 6 is a flow diagram illustrating an example method 600 for operating a cascade phase locked loop circuit, for example as shown in FIG. 2. At 602, a first PLL generates a clock signal having a first frequency. The first PLL may, for example, be the LC-PLL 102 described above with reference to FIG. 1. At 604, a first divider generates a middle frequency clock signal. The first divider may operate using the process shown in block 606. In embodiments, the first divider may be the duty balance programmable divider 206 shown in FIG. 2. In block 606, a count value is increased at 608. At 610, the process determines if the count value has reached a rising target value. If the count value has reached the rising target value, then the process proceeds to 614; otherwise, if the count value has not reached the rising target value the process returns to 608. At 614, an output waveform of the first divider is pulled to logic high, the counting value is reset, and the process returns to 608.

In addition, at 612, the process determines if the count value has reached a falling target value. If the count value has reached the falling target value, then the process proceeds to 616. At 616, the output waveform of the first divider is dropped to logic low.

At 618, a second divider generates a low frequency clock signal and duplicates the middle frequency clock signal. The second divider may operate using the process shown in block 620. In embodiments, the second divider may be the programmable divider with skew balance 210 shown in FIG. 2. At 622, a counting value is increased. At 624, the process determines if the counting value has reached a rising target value. If the counting value has reached the target rising value, then the process proceeds to 626; otherwise, if the counting value has not reached to target rising value, then the process returns to 622 to increase the counting value. At 626, a pulse is generated at an output of the second divider, the counting value is reset, and the process proceeds to 628. At 628, the input middle frequency clock is duplicated, and the output clock is aligned with the input clock.

At 630, a DLL aligns the phase of the middle frequency clock to the phase of an increasing (UP) signal for a second PLL. The DLL may, for example, be the voltage controlled DLL 204 of FIG. 2. The second PLL may, for example, be the RO-PLL 202 shown in FIG. 2. At 632, the second PLL receives a low frequency clock for a reference clock, and uses the middle frequency clock to improve phase noise of the VCO.

Figure 7A:
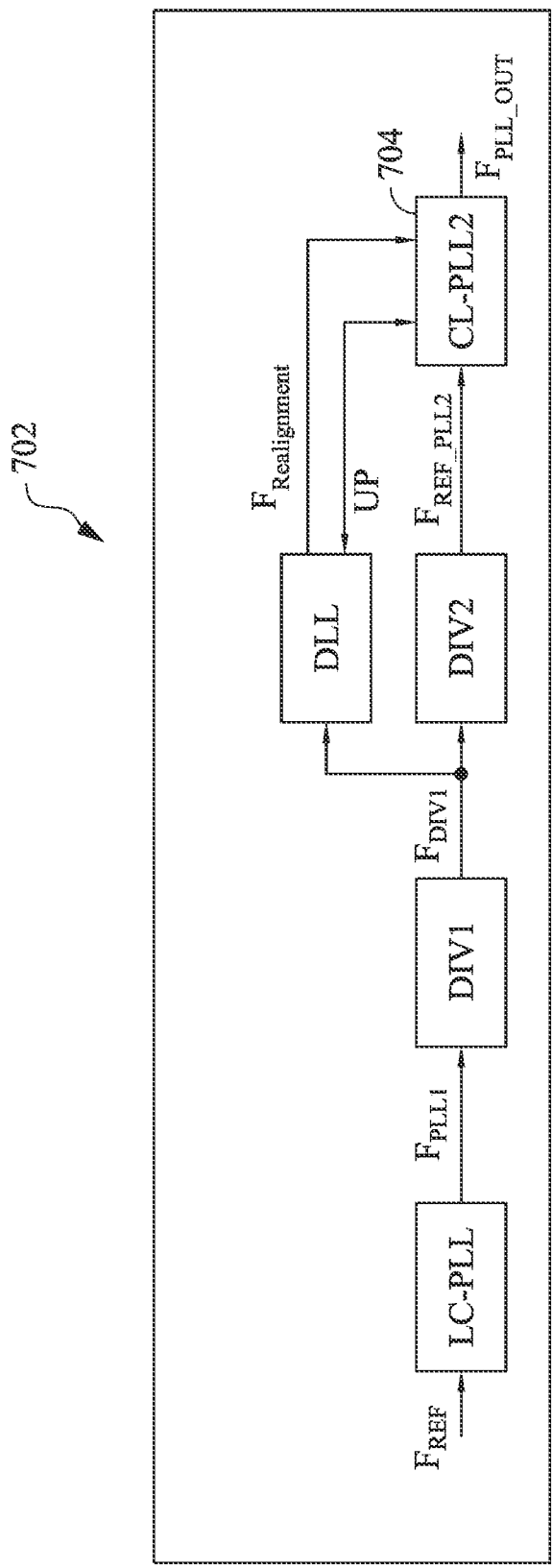
FIGS. 7A-7E show alternate embodiments a cascade PLL circuit.
Figure 7B:
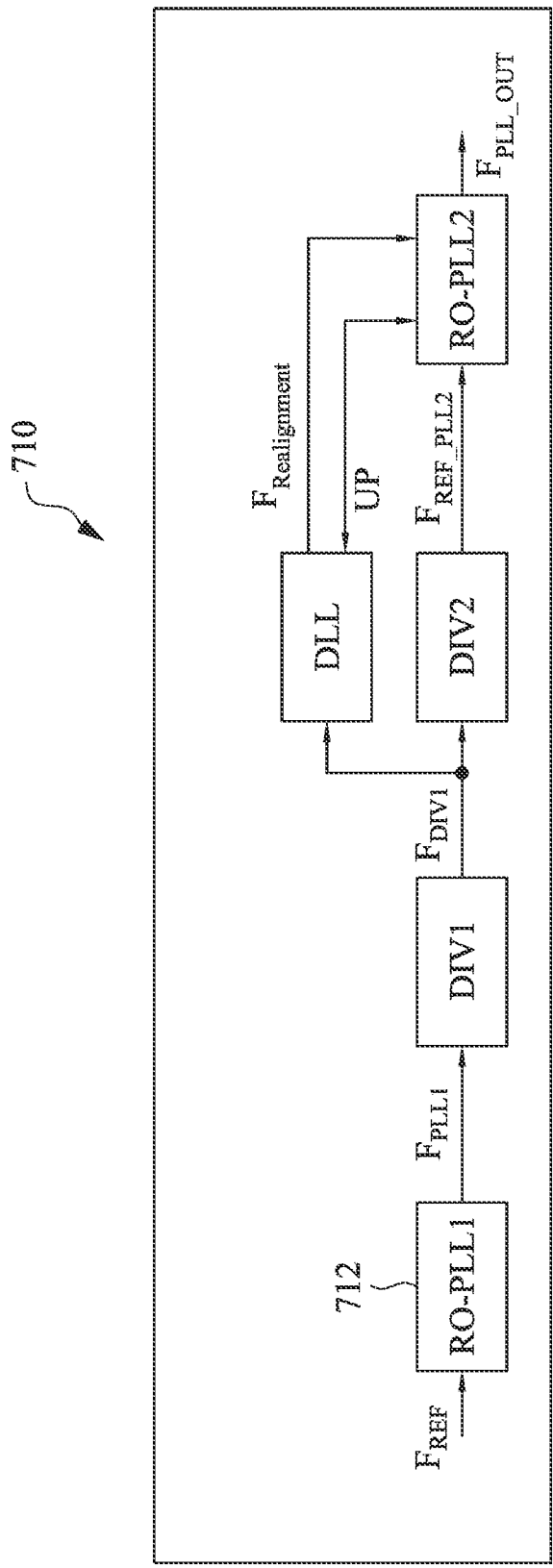
Figure 7C:
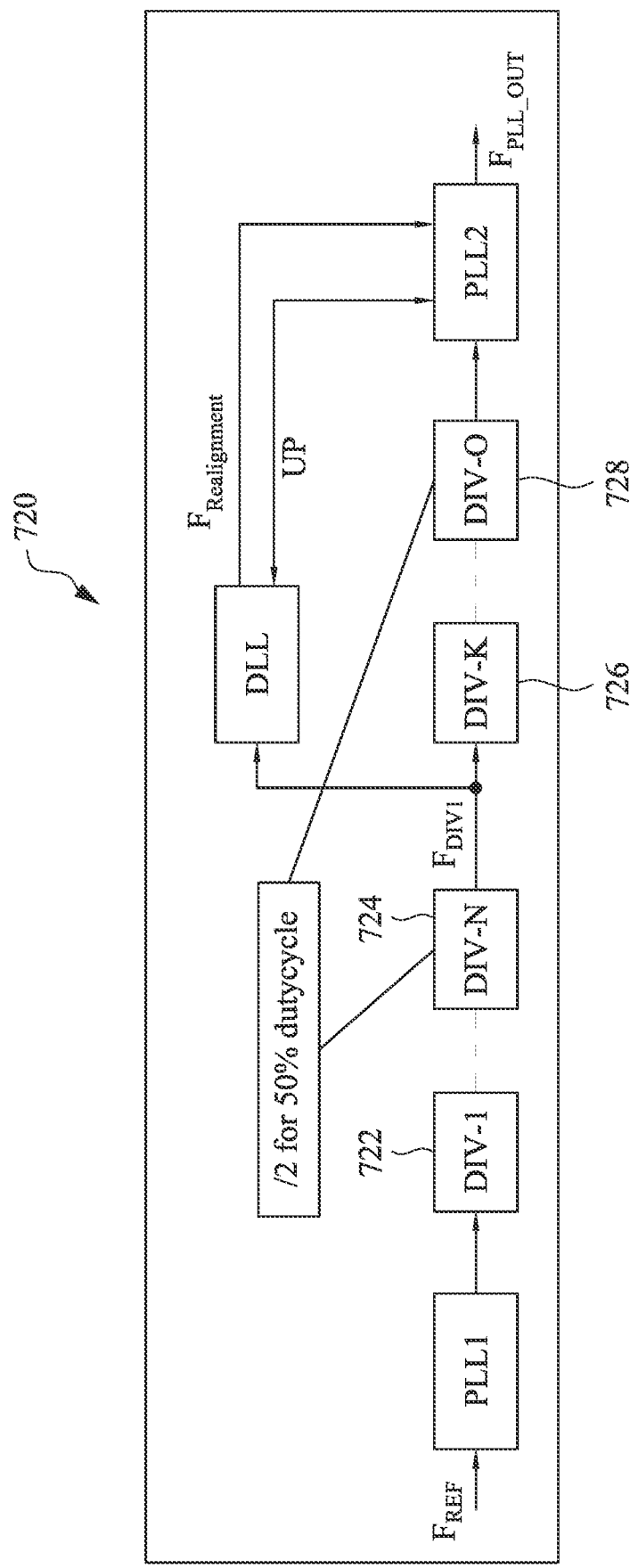
Figure 7E:
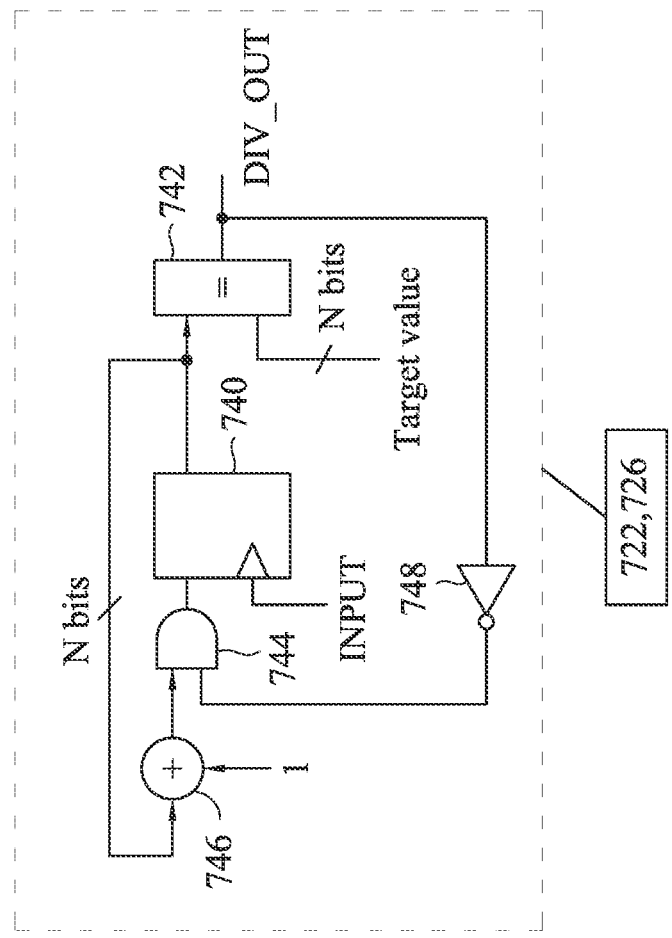
Figure 7D:
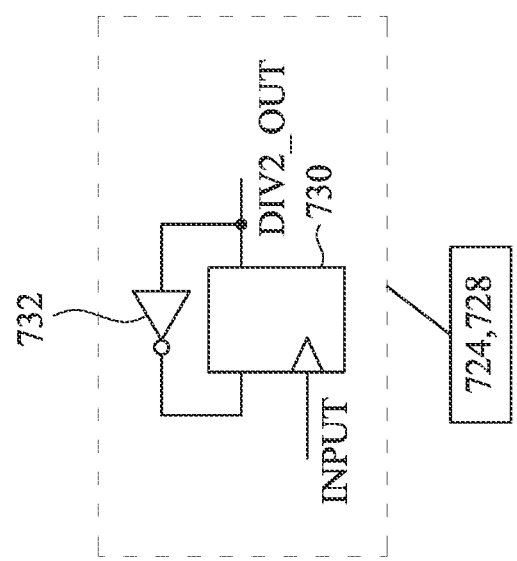

FIGS. 7A-7E show alternate embodiments a cascade phase locked loop (PLL) circuit. The embodiment 702 shown in FIG. 7A is the same as the cascade PLL 100 shown in FIG. 1, except that the second PLL 704 is another LC-PLL, instead of a RO-PLL. The embodiment 710 shown in FIG. 7B is the same as the cascade PLL 100 shown in FIG. 1, except that the first PLL 712 is another RO-PLL, instead of a LC-PLL. The embodiment 720 shown in FIG. 7C is same as the cascade PLL of FIG. 1, except that the first second divider is replaced by a first chain of dividers 722, 744, and the second divider is replaced by a second chain of dividers 726, 728. An example implementation for divider 724 and divider 728 of FIG. 7C is shown in FIG. 7D, and an example implementation for divider 722 and 726 in FIG. 7C is shown in FIG. 7E.

With reference to FIG. 7D, dividers 724 and 728 may include a latch 730 and a feedback inverter 732. The input to the divider 724, 728 is used to clock the latch 730, and the output (DIV2_OUT) of the latch 730 is inverted by the feedback inverter 732 and then fed back to the latch input.

With reference to FIG. 7E, dividers 722 and 726 may include a latch 740, a comparator 742, a logic (AND) gate 744, an adder 746, and an inverter 748. The input to the divider 722, 726 is used to clock the latch 740. The latch 740 output is compared to a target value by the comparator 742 to generate the divider output (DIV_OUT). The divider output (DIV_OUT) in inverted by the inverter 748 and then fed back to a first input to the logic (AND) gate 744. The latch 740 output is also fed back to the adder 746, which increases the output by "1" to generate a second input to the logic (AND) gate 744. The output of the logic (AND) gate 744 is received as the input to the latch 740.

Figure 8A:
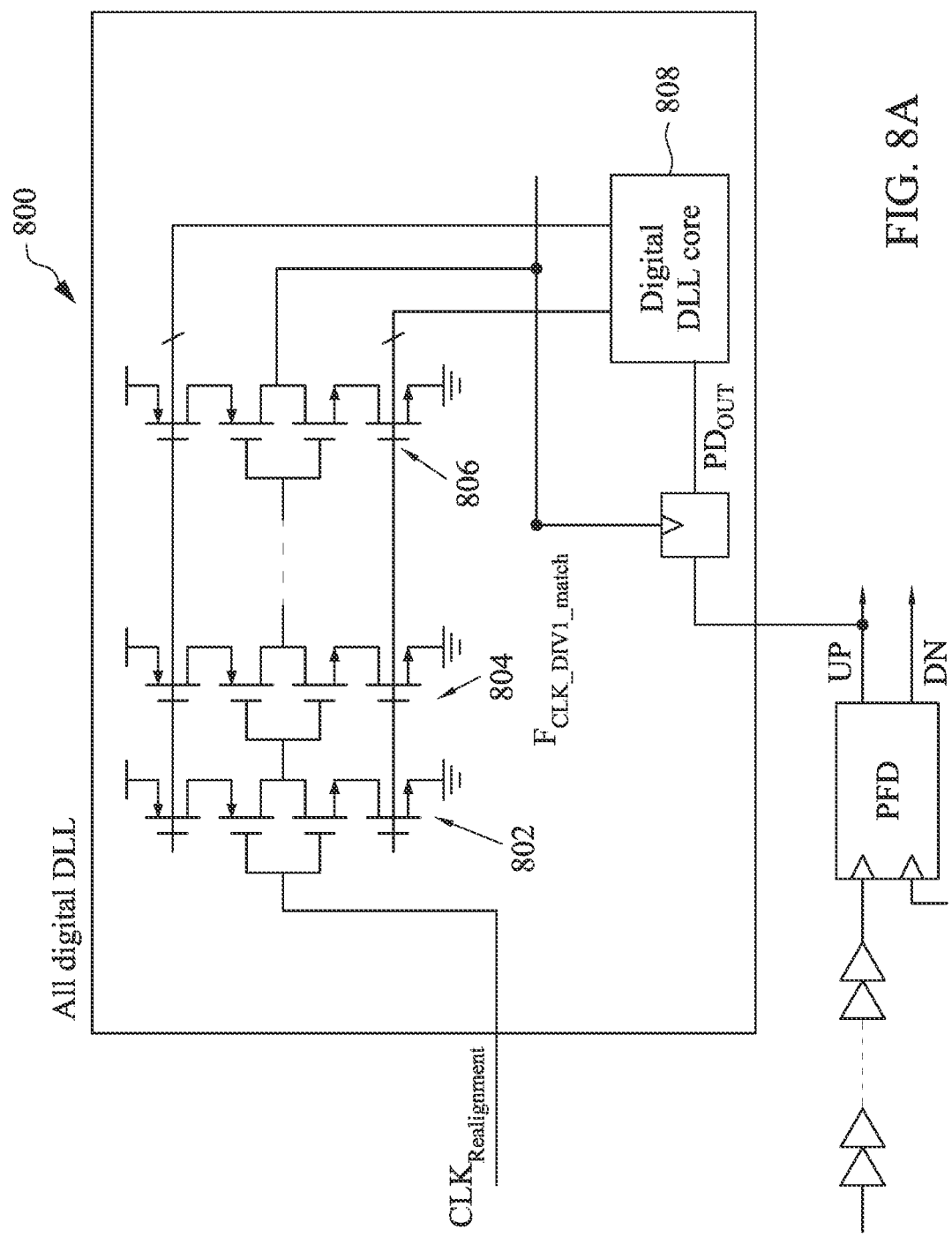
FIGS. 8A and 8B show an alternative digital embodiment for the DLL of FIG. 2C.
Figure 8B:
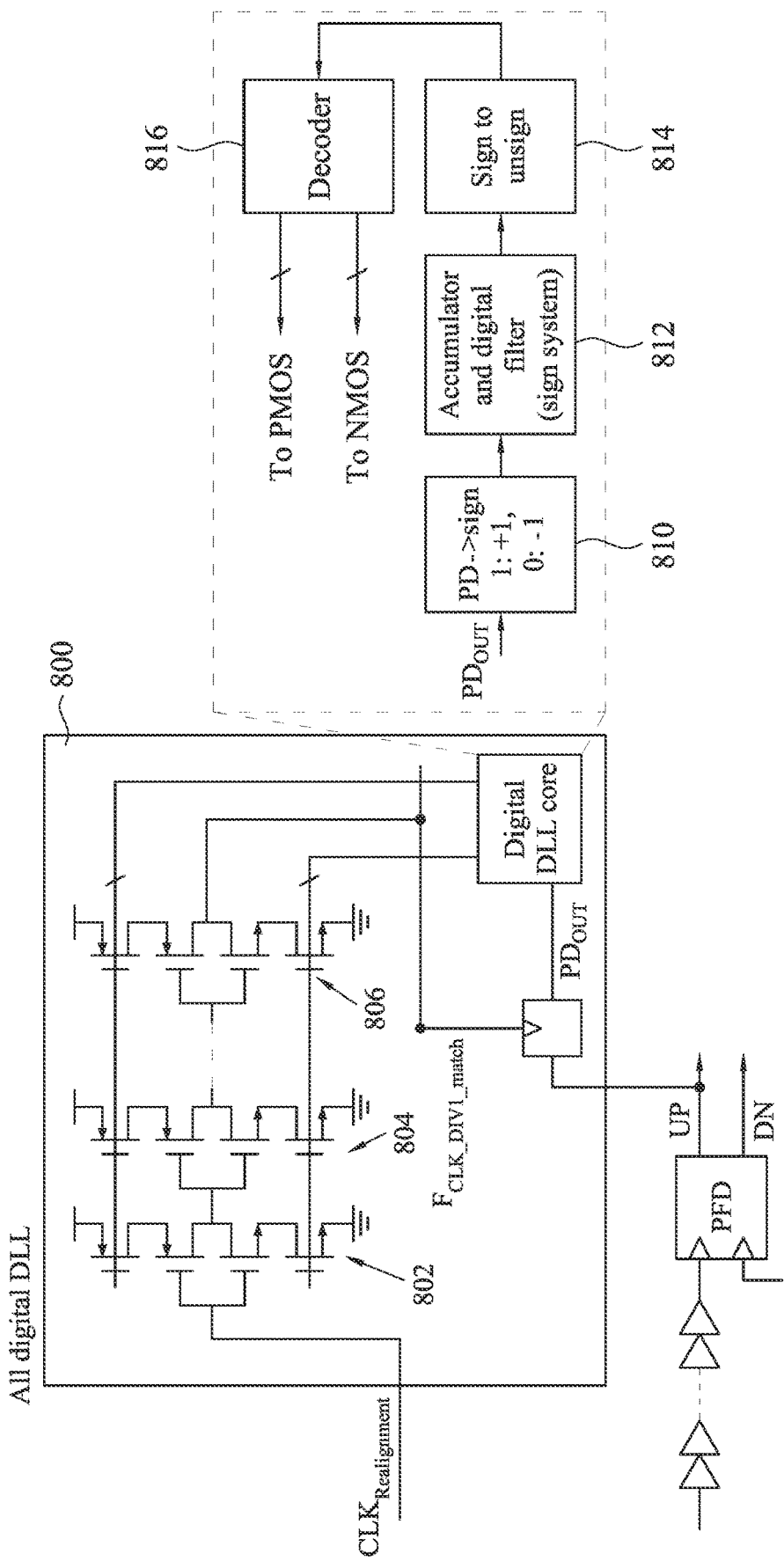

FIG. 8A is an alternative digital embodiment 800 for the DLL of FIG. 2C. In this embodiment 800, the voltage controlled delay train 502 of FIG. 2C is replaced with an array of transistor delay circuits 802, 804, 806. The array of transistor delay circuits 802, 804, 806 is controlled to add/remove delay by a digital DLL core 808. An example implementation of the digital DLL core 808 is shown in FIG. 8B. As shown in FIG. 8B, the digital DLL core 808 may include a first digital converter 810, an accumulator and digital filter 812, a second digital converter 814 and a decoder 816. The first digital converter 810 converts the PDout signal to a differential digital signal, converting logic high "1" values in the PDout signal to "+1" and converting logic low "0" values in the PDout signal to "−1." The accumulator and digital filter 812 converts the differential digital (+/−1) signal to numbers that are input to a sign-to-unsign converter 814 that generates an input to the decoder 816 to control the PMOS/NMOS devices in the array of transistor delay circuits 802, 804, 806 of the delay train 502.

Figure 9:
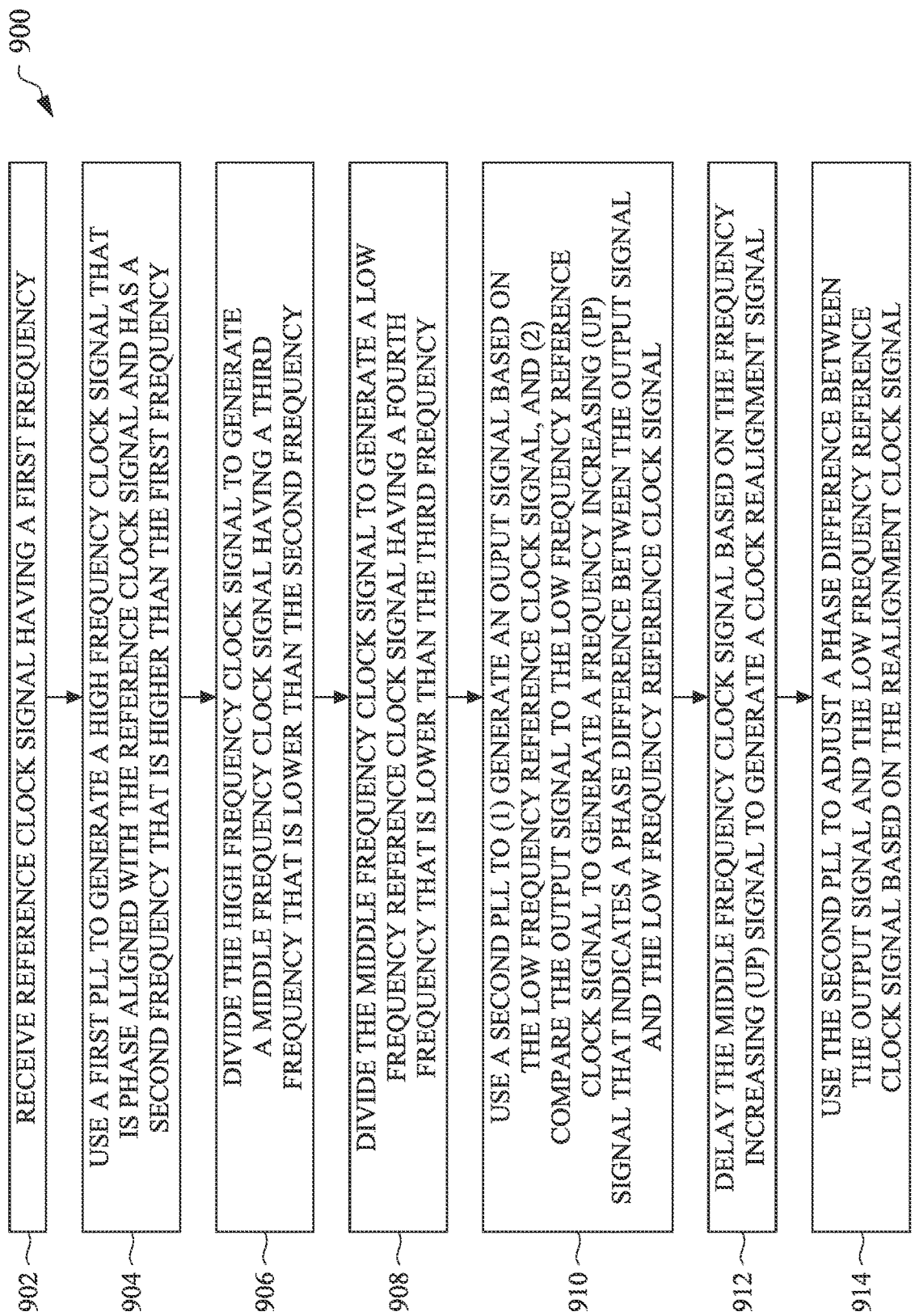
FIG. 9 is a flow diagram illustrating and example method 900 for generating an output signal that is phase locked with a reference clock signal.

FIG. 9 is a flow diagram illustrating and example method 900 for generating an output signal that is phase locked with a reference clock signal. At 902, comprising: a reference clock having a first frequency is received. At 904, a first phase locked loop (PLL) is used to generate a high frequency clock signal that is phase aligned with the reference clock signal, the high frequency clock signal having a second frequency that is higher than the first frequency. At 906, the high frequency clock signal is divided to generate a middle frequency clock signal having a third frequency that is lower than the second frequency. At 908, the middle frequency clock signal is divided to generate a low frequency reference clock signal having a fourth frequency that is lower than the third frequency. At 910, a second PLL is used to (1) generate an output signal based on the low frequency reference clock signal, and (2) compare the output signal to the low frequency reference clock signal to generate a frequency increasing (UP) signal that indicates a phase difference between the output signal and the low frequency reference clock signal. At 912, the middle frequency clock signal is delayed based on the frequency increasing (UP) signal to generate a realignment clock signal. At 912, the second PLL is used to adjust a phase difference between the output signal and the low frequency reference clock signal based on the realignment clock signal.

Systems and methods as described herein may take a variety of forms. In one example, a cascade phase locked loop circuit is provided that includes a first phase locked loop, a first divider, a second divider, a second phase locked loop, and a delay locked loop. The first phase locked loop receives a reference clock signal having a first frequency and generates a high frequency clock signal that is phase aligned with the reference clock signal, the high frequency clock signal having a second frequency that is higher than the first frequency. The first divider receives the high frequency clock signal and reduces the second frequency to generate a middle frequency clock signal having a third frequency that is lower than the second frequency. The second divider receives the middle frequency clock signal and reduces the third frequency to generate a low frequency reference clock signal having a fourth frequency that is lower than the third frequency. The second phase locked loop receives the low frequency reference clock signal and generates an output signal, the second phase lock loop being configured to compare the output signal to the low frequency reference clock signal to generate a frequency increasing (UP) signal that indicates a phase difference between the output signal and the low frequency reference clock signal, and the second phase lock loop being further configured to receive a realignment clock signal and adjust the phase difference between the output signal and the low frequency reference clock signal based on the realignment clock signal. The delay locked loop receives the middle frequency clock signal and the frequency increasing (UP) signal and delays the middle frequency clock signal based on the frequency increasing (UP) signal to generate the realignment clock signal. In embodiments, the first phase locked loop is an inductance capacitance (LC) phase locked loop and the second phase locked loop is a ring-oscillator (RO) phase locked loop.

In another example, a cascade phase locked loop is provided that includes a first phase locked loop, a two-stage programmable divider, a second phase locked loop, and a delay locked loop. The first phase locked loop receives a reference clock signal having a first frequency and generates a high frequency clock signal that is phase aligned with the reference clock signal, the high frequency clock signal having a second frequency that is higher than the first frequency. The two-stage programmable divider includes a first divider stage and a second divider stage. The first divider stage is configured to receive the high frequency clock signal and reduce the second frequency to generate a middle frequency clock signal having a third frequency that is lower than the second frequency. The second divider stage is configured to receive the middle frequency clock signal and reduce the third frequency to generate a low frequency reference clock signal having a fourth frequency that is lower than the third frequency. The second divider stage is further configured to phase align the middle frequency clock signal and the low frequency clock signal to generate a matched middle frequency clock signal and a matched low frequency reference clock signal. The second phase locked loop receives the matched low frequency reference clock signal and generates an output signal, the second phase lock loop being configured to compare the output signal to the matched low frequency reference clock signal to generate a frequency increasing (UP) signal that indicates a phase difference between the output signal and the matched low frequency reference clock signal, and the second phase lock loop being further configured to receive a realignment clock signal and adjust the phase difference between the output signal and the matched low frequency reference clock signal based on the realignment clock signal. The delay locked loop receives the matched middle frequency clock signal and the frequency increasing (UP) signal and delays the matched middle frequency clock signal based on the frequency increasing (UP) signal to generate the realignment clock signal. In embodiments, the first divider stage is a duty balance programmable divider that adjusts a falling edge of the middle frequency clock signal based on a divide number input, and the second divider stage is a programmable divider that divides the middle frequency clock signal based on a second divide number input to generate the low frequency reference clock signal. In embodiments, the second divider stage includes a latch circuit that resamples the middle frequency clock signal based on the rising and falling edges of the low frequency reference clock signal to generate a retimed middle frequency clock signal, and a logic gate that receives the retimed middle frequency clock signal at a first input and receives the low frequency reference clock signal at a second input and generates the matched middle frequency clock signal. In embodiments, the second divider further comprises a second logic gate that receives the low frequency reference clock signal at a first input and a dummy input at a second input and generates the matched low frequency reference clock signal. In embodiments, the first and second logic gates are AND gates and the dummy input is logic high. In embodiments, the delay locked loop includes a voltage-controlled delay train that delays the matched middle frequency clock signal by a delay amount that is controlled by a delay tuning voltage to generate the realignment clock signal. In embodiments, the delay tuning voltage is controlled based on the frequency increasing (UP) signal in order to account for signal latency within the a second phase locked loop. In embodiments, the delay locked loop includes a digital delay circuit that delays the matched middle frequency clock signal by a delay amount that is controlled by one or more digital control signals to generate the realignment clock signal, the one or more digital control signals being generated based on the frequency increasing (UP) signal in order to account for signal latency within the a second phase locked loop. In embodiments, the first phase locked loop is an inductance capacitance (LC) phase locked loop and the second phase locked loop is a ring-oscillator (RO) phase locked loop. In embodiments, the first and second phase locked loops are inductance capacitance (LC) phase locked loops. In embodiments, the first and second phase locked loops are ring-oscillator (RO) phase locked loops.

In another example, a method for generating an output signal that is phase locked with a reference clock signal is provided that comprises: receiving the reference clock signal, having a first frequency, at a first phase locked loop; generating, by the first phase locked loop, a high frequency clock signal that is phase aligned with the reference clock signal, the high frequency clock signal having a second frequency that is higher than the first frequency; dividing the high frequency clock signal to generate a middle frequency clock signal having a third frequency that is lower than the second frequency; dividing the middle frequency clock signal to generate a low frequency reference clock signal having a fourth frequency that is lower than the third frequency; receiving the low frequency reference clock signal at a second phase locked loop; generating, by the second phase locked loop, the output signal based on the low frequency reference clock signal; comparing, by the second phase locked loop, the output signal to the low frequency reference clock signal to generate a frequency increasing (UP) signal that indicates a phase difference between the output signal and the low frequency reference clock signal; delaying the middle frequency clock signal based on the frequency increasing (UP) signal to generate a realignment clock signal; and adjusting, by the second phase locked loop, a phase difference between the output signal and the low frequency reference clock signal based on the realignment clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A cascade phase locked loop circuit, comprising:
a first phase locked loop configured to receive a reference clock signal having a first frequency and generate a high frequency clock signal that is phase aligned with the reference clock signal, the high frequency clock signal having a second frequency that is higher than the first frequency;
a first divider configured to receive the high frequency clock signal and reduce the second frequency to generate a middle frequency clock signal having a third frequency that is lower than the second frequency;
a second divider configure to receive the middle frequency clock signal and reduce the third frequency to generate a low frequency reference clock signal having a fourth frequency that is lower than the third frequency;
a second phase locked loop configured to receive the low frequency reference clock signal and generate an output signal, the second phase lock loop being configured to compare the output signal to the low frequency reference clock signal to generate a frequency increasing (UP) signal that indicates a phase difference between the output signal and the low frequency reference clock signal, and the second phase lock loop being further configured to receive a realignment clock signal and adjust the phase difference between the output signal and the low frequency reference clock signal based on the realignment clock signal; and
a delay locked loop configured to receive the middle frequency clock signal and the frequency increasing (UP) signal and delay the middle frequency clock signal based on the frequency increasing (UP) signal to generate the realignment clock signal.

2. The cascade phase locked loop circuit of claim 1, wherein the first phase locked loop is an inductance capacitance (LC) phase locked loop.

3. The cascade phase locked loop circuit of claim 1, wherein the second phase locked loop is a ring-oscillator (RO) phase locked loop.

4. The cascade phase locked loop circuit of claim 3, wherein the realignment clock signal adjusts a voltage controlled oscillator (VCO) in the RO phase locked loop to phase align the output signal and the low frequency reference clock signal.

5. A cascade phase locked loop circuit, comprising:
a first phase locked loop configured to receive a reference clock signal having a first frequency and generate a high frequency clock signal that is phase aligned with the reference clock signal, the high frequency clock signal having a second frequency that is higher than the first frequency;
a two-stage programmable divider having a first divider stage and a second divider stage,
the first divider stage being configured to receive the high frequency clock signal and reduce the second frequency to generate a middle frequency clock signal having a third frequency that is lower than the second frequency,
the second divider stage being configured to receive the middle frequency clock signal and reduce the third frequency to generate a low frequency reference clock signal having a fourth frequency that is lower than the third frequency,
the second divider stage being further configured to phase align the middle frequency clock signal and the low frequency clock signal to generate a matched middle frequency clock signal and a matched low frequency reference clock signal;
a second phase locked loop configured to receive the matched low frequency reference clock signal and generate an output signal, the second phase lock loop being configured to compare the output signal to the matched low frequency reference clock signal to generate a frequency increasing (UP) signal that indicates a phase difference between the output signal and the matched low frequency reference clock signal, and the second phase lock loop being further configured to receive a realignment clock signal and adjust the phase difference between the output signal and the matched low frequency reference clock signal based on the realignment clock signal; and
a delay locked loop configured to receive the matched middle frequency clock signal and the frequency increasing (UP) signal and delay the matched middle frequency clock signal based on the frequency increasing (UP) signal to generate the realignment clock signal.

6. The cascade phase locked loop circuit of claim 5, wherein the first divider stage is a duty balance programmable divider that adjusts a falling edge of the middle frequency clock signal based on a divide number input.

7. The cascade phase locked loop circuit of claim 5, wherein the second divider stage is a programmable divider that divides the middle frequency clock signal based on a divide number input to generate the low frequency reference clock signal.

8. The cascade phase locked loop circuit of claim 7, wherein the second divider stage comprises,
a latch circuit that resamples the low frequency clock signal based on the rising and falling edges of the middle frequency reference clock signal to generate a retimed low frequency clock signal, and
a logic gate that receives the retimed low frequency clock signal at a first input and receives the middle frequency reference clock signal at a second input and generates the matched low frequency clock signal.

9. The cascade phase locked loop circuit of claim 8, wherein the second divider further comprises a second logic gate that receives the middle frequency reference clock signal at a first input and a dummy input at a second input and generates the matched middle frequency reference clock signal.

10. The cascade phase locked loop circuit of claim 9, wherein the first and second logic gates are AND gates and the dummy input is logic high.

11. The cascade phase locked loop circuit of claim 5, wherein the delay locked loop includes a voltage-controlled delay train that delays the matched middle frequency clock signal by a delay amount that is controlled by a delay tuning voltage to generate the realignment clock signal.

12. The cascade phase locked loop circuit of claim 11, wherein the delay tuning voltage is controlled based on the frequency increasing (UP) signal in order to account for signal latency within the second phase locked loop.

13. The cascade phase locked loop circuit of claim 5, wherein the delay locked loop includes a digital delay circuit that delays the matched middle frequency clock signal by a delay amount that is controlled by one or more digital control signals to generate the realignment clock signal, the one or more digital control signals being generated based on the frequency increasing (UP) signal in order to account for signal latency within the second phase locked loop.

14. The cascade phase locked loop circuit of claim 5, wherein the first phase locked loop is an inductance capacitance (LC) phase locked loop and the second phase locked loop is a ring-oscillator (RO) phase locked loop.

15. The cascade phase locked loop circuit of claim 5, wherein the first and second phase locked loops are inductance capacitance (LC) phase locked loops.

16. The cascade phase locked loop circuit of claim 5, wherein the first and second phase locked loops are ring-oscillator (RO) phase locked loops.

17. A method for generating an output signal that is phase locked with a reference clock signal, comprising:
receiving the reference clock signal, having a first frequency, at a first phase locked loop;
generating, by the first phase locked loop, a high frequency clock signal that is phase aligned with the reference clock signal, the high frequency clock signal having a second frequency that is higher than the first frequency;
dividing the high frequency clock signal to generate a middle frequency clock signal having a third frequency that is lower than the second frequency;
dividing the middle frequency clock signal to generate a low frequency reference clock signal having a fourth frequency that is lower than the third frequency;
receiving the low frequency reference clock signal at a second phase locked loop;
generating, by the second phase locked loop, the output signal based on the low frequency reference clock signal;
comparing, by the second phase locked loop, the output signal to the low frequency reference clock signal to generate a frequency increasing (UP) signal that indicates a phase difference between the output signal and the low frequency reference clock signal;
delaying the middle frequency clock signal based on the frequency increasing (UP) signal to generate a realignment clock signal; and
adjusting, by the second phase locked loop, a phase difference between the output signal and the low frequency reference clock signal based on the realignment clock signal.

18. The method of claim 17, further comprising:
aligning a phase of the middle frequency clock signal with a phase of the low frequency clock signal.

19. The method of claim 17, wherein the first phase locked loop is an inductance capacitance (LC) phase locked loop and the second phase locked loop is a ring-oscillator (RO) phase locked loop.

20. The method of claim 19, further comprising:
adjusting, by the RO phase locked loop, a voltage controlled oscillator (VCO) based on the realignment clock signal to phase align the output signal and the low frequency reference clock signal.

* * * * *